(12) United States Patent
Anzai

(10) Patent No.: US 11,441,335 B2
(45) Date of Patent: Sep. 13, 2022

(54) VEHICULAR PORTABLE DEVICE

(71) Applicant: DENSO CORPORATION, Kariya (JP)

(72) Inventor: Tetsuyuki Anzai, Kariya (JP)

(73) Assignee: DENSO CORPORATION, Kariya (JP)

( * ) Notice: Subject to any disclaimer, the term of this patent is extended or adjusted under 35 U.S.C. 154(b) by 675 days.

(21) Appl. No.: 16/509,579

(22) Filed: Jul. 12, 2019

(65) Prior Publication Data

US 2019/0338563 A1 Nov. 7, 2019

Related U.S. Application Data

(63) Continuation of application No. PCT/JP2017/046324, filed on Dec. 25, 2017.

(30) Foreign Application Priority Data

Feb. 3, 2017 (JP) .............................. JP2017-018666

(51) Int. Cl.
| | |
|---|---|
| *E05B 49/00* | (2006.01) |
| *G06F 3/0488* | (2022.01) |
| *E05B 19/00* | (2006.01) |
| *H01H 36/00* | (2006.01) |
| *H05K 1/02* | (2006.01) |

(52) U.S. Cl.
CPC ............ *E05B 49/006* (2013.01); *E05B 19/00* (2013.01); *G06F 3/0488* (2013.01); *H01H 36/00* (2013.01); *H05K 1/0275* (2013.01)

(58) Field of Classification Search
CPC ...... E05B 49/006; E05B 19/00; G06F 3/0488; H01H 36/00; H05K 1/0275
USPC ............................................................ 701/2
See application file for complete search history.

(56) References Cited

U.S. PATENT DOCUMENTS

2012/0283894 A1* 11/2012 Naboulsi ................. G06F 3/016
                                                                    701/1
2015/0241971 A1* 8/2015 Abe ..................... G06F 3/04812
                                                                    345/173

FOREIGN PATENT DOCUMENTS

| JP | H04059270 U | 5/1992 |
| JP | 4301303 B2 | 7/2009 |
| JP | 2015181055 A | 10/2015 |
| JP | 2016188526 A | 11/2016 |

* cited by examiner

*Primary Examiner* — Gertrude Arthur Jeanglaude
(74) *Attorney, Agent, or Firm* — Harness, Dickey & Pierce, P.L.C.

(57) ABSTRACT

In a vehicular portable device, a display unit is controlled to display an icon representing an instruction to an in-vehicle device when detecting that an acceleration equal to or greater than an activation threshold occurs in the vehicular portable device, a pressing force at an icon selection position, which is a position where the icon is selected by a touch sensor, is detected, and a control signal instructing execution of a command corresponding to the icon being selected is transmitted based on detection of the pressing force in a state where the icon is selected.

9 Claims, 5 Drawing Sheets

VEHICULAR PORTABLE DEVICE

CROSS REFERENCE TO RELATED APPLICATIONS

The present application is a continuation application of International Patent Application No. PCT/JP2017/046324 filed on Dec. 25, 2017, which designated the United States and claims the benefit of priority from Japanese Patent Application No. 2017-018666 filed on Feb. 3, 2017. The entire disclosures of all of the above applications are incorporated herein by reference.

TECHNICAL FIELD

The present disclosure relates to a vehicular portable device.

BACKGROUND

Conventionally, a vehicular portable device is used, for example, for remote control of locking and unlocking of a door of a vehicle or remote control of opening and closing of the door of the vehicle.

SUMMARY

The present disclosure provides a vehicular portable device in which a display unit is controlled to display an icon representing an instruction to an in-vehicle device when detecting that an acceleration equal to or greater than an activation threshold occurs in the vehicular portable device, a pressing force at an icon selection position, which is a position where the icon is selected by a touch sensor, is detected, and a control signal instructing execution of a command corresponding to the icon being selected is transmitted based on detection of the pressing force in a state where the icon is selected.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
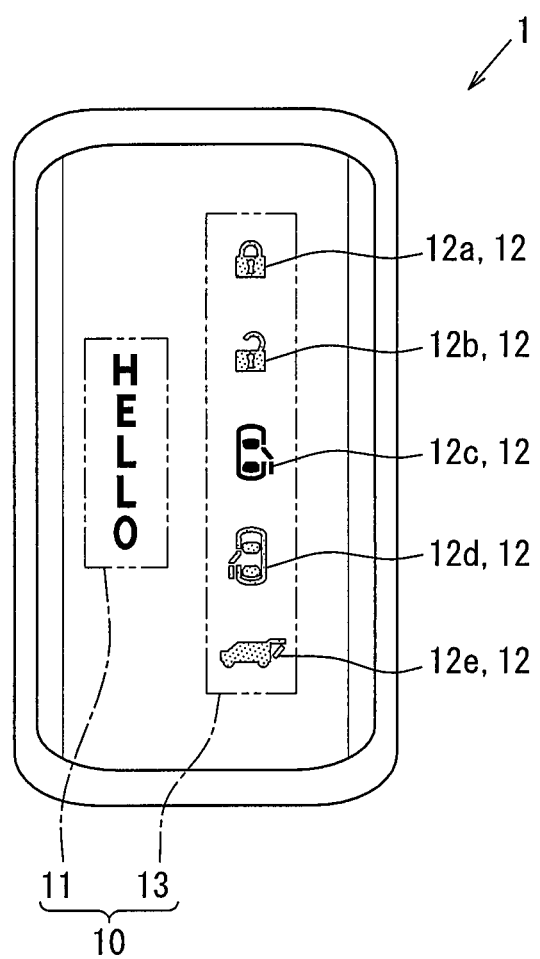
FIG. 1 is a plan view of a portable device.

Before describing embodiments of the present disclosure, a vehicular portable device according to a comparative example will be described. In the vehicular portable device according to the comparative example, when a knob is pressed, multiple icons representing functions capable of instructing from the vehicular portable device to the vehicle are displayed on an icon display unit. The reason why the icon is not displayed on the icon display unit until the knob is pressed is to reduce a power consumption.

When a user presses the knob after performing an operation of selecting one icon from multiple icons in a state where the icons are displayed on the icon display unit, a control signal corresponding to the icon selected at that time is transmitted from the vehicular portable device to an in-vehicle device that is mounted in the vehicle.

If the multiple icons are displayed on the display unit and the function to be executed by the in-vehicle device is selected by selecting any icon as in the vehicular portable device according to the comparative example, the multi-function device can be easily performed.

However, when the user transmits a control signal to the in-vehicle device with the use of the vehicular portable device according to the comparative example, it is required that the user first presses the knob to display the icons on the icon display unit, then operates an operation unit different from the knob to select one icon, and then presses the knob again. Thus, there is an issue that the operation is troublesome.

A vehicular portable device according to one aspect of the present disclosure is a vehicular portable device carried by a user of a vehicle and transmitting a control signal to an in-vehicle device mounted on the vehicle, and the vehicular portable device includes an acceleration sensor, a display unit that displays an icon representing an instruction to the in-vehicle device, a display control unit that controls the display unit to display the icon when detecting that an acceleration equal to or greater than an activation threshold occurs in the vehicular portable device based on a signal output from the acceleration sensor, a touch sensor to select the icon displayed on the display unit, a pressure sensor that detects a pressing force at an icon selection position, which is a position where the icon is selected by the touch sensor, and a transmission control unit that transmits a control signal instructing execution of a command corresponding to the icon being selected based on detection of the pressing force by the pressure sensor in a state where the icon is selected.

In the vehicular portable device according to the one aspect of the present disclosure, the display control unit controls the display unit to display the icon based on detection of occurrence of the acceleration equal to or greater than the activation threshold in the vehicular portable device. Therefore, the user can display the icon on the display unit only by taking the vehicular portable device out from a bag or a pocket without performing an operation such as pressing an on-switch.

Further, the pressure sensor included in the vehicular portable device detects the pressing force at the icon selection position, and the transmission control unit transmits the control signal instructing execution of the command corresponding to the icon being selected based on the detection of the pressing force by the pressure sensor. Therefore, the user can transmit the control signal instructing execution of the command corresponding to the icon being selected by performing the pressing operation at the position as it is after selecting the icon. In other words, the user can perform the operation of transmitting the control signal at the position of the finger as it is, subsequently to the operation of selecting the icon.

As described above, according to the one aspect of the present disclosure, the icon can be displayed on the display unit only by taking the vehicular portable device out from the bag or the pocket, and the operation of transmitting the control signal can be performed at the position of the finger as it is, subsequently to the operation of selecting the icon. This facilitates the operation until the control signal is transmitted to the in-vehicle device.

Embodiments of the present disclosure will be described below with reference to the drawings. FIG. 1 is a plan view of a vehicular portable device (hereinafter, referred simply as a portable device) 1 according to the present disclosure. The portable device 1 is carried by a user of a vehicle and is used for performing a remote control of the vehicle such as locking and unlocking of a door of the vehicle.

As shown in FIG. 1, a portable device 1 according to the present embodiment has a substantially rectangular shape in a plan view and includes a display unit 10. The display unit 10 includes a message display region 11 for displaying a message and an icon display region 13 for displaying icons 12. In a state of FIG. 1, "HELLO" is displayed in the message display region 11, and five icons 12a, 12b, 12c, 12d, and 12e are displayed in different positions in the icon display region 13.

The icon 12 is a figure representing an instruction to the in-vehicle device mounted on the vehicle. The in-vehicle device performs locking and unlocking control of the vehicle door, opening and closing control of the door, and the like. The icon 12a is an icon indicating the locking of the vehicle door. The icon 12b is an icon indicating unlocking of the vehicle door. The icon 12c is an icon indicating the opening and closing of an electric slide door on a right side of the vehicle. The icon 12d is an icon indicating the opening and closing of an electric slide door on a left side of the vehicle. The icon 12e is an icon indicating the opening and closing of a back door of the vehicle.

When the user selects the icon 12 and performs the operation of transmitting the control signal, the control signal corresponding to the selected icon 12 is transmitted to the in-vehicle device. The number of the icons 12 and the instruction contents indicated by the icons 12 are not limited to those described above. In addition to the above contents, the icons may indicate an engine start and opening and closing of a window.

Figure 2:
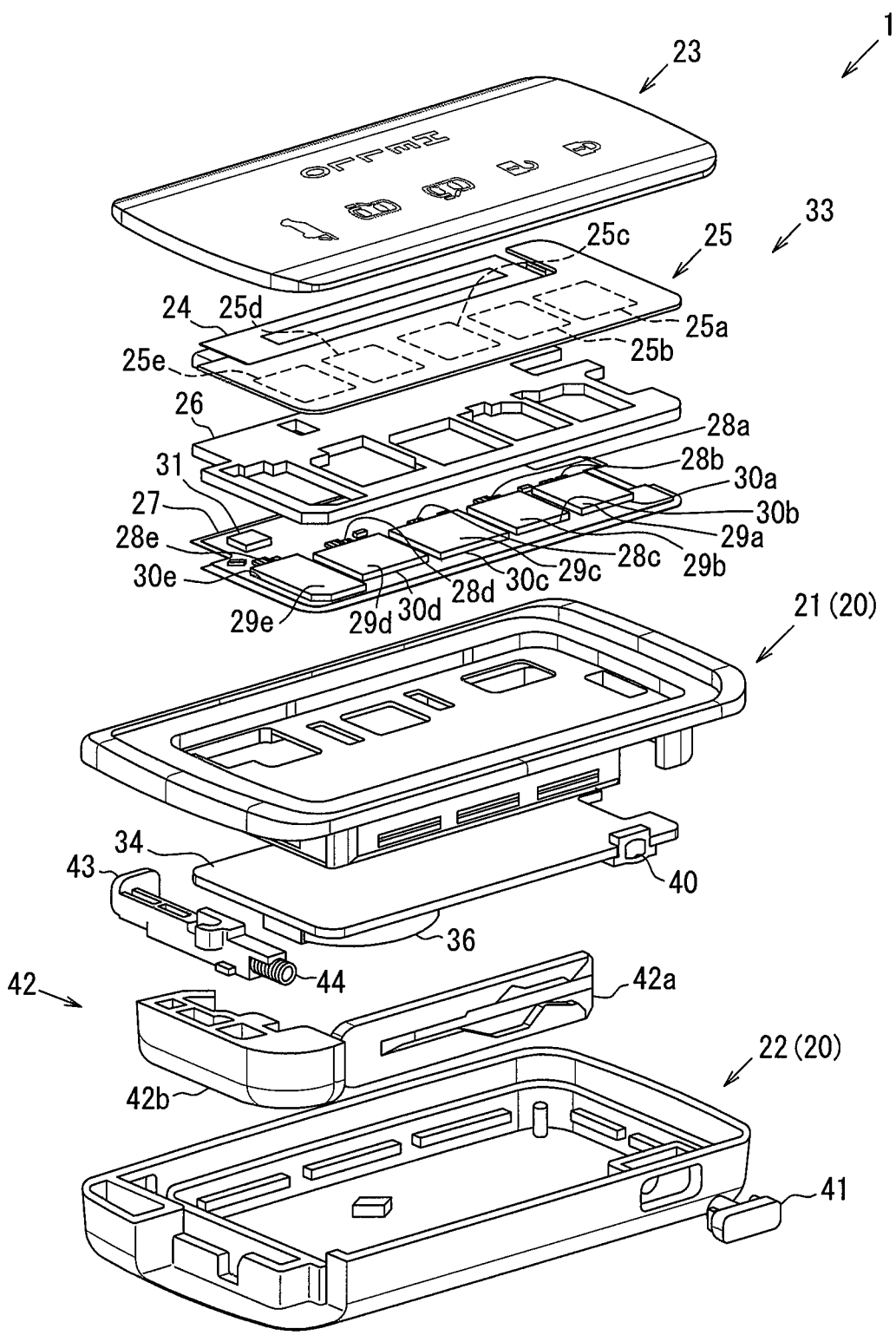
FIG. 2 is an exploded perspective view of the portable device.

FIG. 2 is an exploded perspective view of the portable device 1. An internal configuration of the portable device 1 will be described with reference to FIG. 2. The portable device 1 includes an upper cover 21 and a lower cover 22. The upper cover 21 and the lower cover 22 are made of resin. The materials of the upper cover 21 and the lower cover 22 may be the same as or different from each other. The upper cover 21 and the lower cover 22 are fitted to each other at an outer peripheral portion to form a housing 20. The housing 20 has an accommodation space inside, and various components are accommodated in the housing 20.

A display cover 23 serving as a display surface is disposed on an upper side of the upper cover 21, that is, on a surface of the upper cover 21 opposite to the lower cover 22. A recess for fitting the display cover 23 is provided in the upper cover 21 on the surface opposite to the lower cover 22, and the display cover 23 is fitted in the recess. In this example, the display cover 23 is made of acrylic. Alternatively, the display cover 23 may be made of other materials such as polycarbonate and glass.

The display unit 10 described above is a partial region of the display cover 23. The message display region 11 is light transmissive. A display 24 is disposed on a rear side of the message display region 11, and light representing various messages displayed on the display 24 can be visually recognized from an outside of the portable device 1 through the message display region 11.

In the icon display region 13, a light transmissive region is provided in the shape of the icons 12. LEDs 28a, 28b, 28c, 28d, and 28e and light guides 29a, 29b, 29c, 29d, and 29e are disposed over the rear surface of the icon display region 13 through a sensor sheet 25 or the like. When the five LEDs 28a, 28b, 28c, 28d, and 28e are not distinguished from each other, those LEDs are indicated as the LEDs 28, and when the five light guides 29a, 29b, 29c, 29d, and 29e are not distinguished from each other, those light guides are indicated as the light guides 29.

The light emitted by the LEDs 28 is projected onto the icons 12 through the light guides 29, whereby the icons 12 can be visually recognized from the outside of the portable device 1. In the display cover 23, a portion other than the message display region 11 and the icon display region 13 has a light shielding property.

In a state where the display cover 23 is attached to the upper cover 21, an accommodation space is also provided between the display cover 23 and the upper cover 21. A display 24, a sensor sheet 25, a spacer 26, a flexible printed circuit (FPC: Flexible Printed Circuits; hereinafter referred to as FPC) 27, and the like are accommodated in the accommodation space.

On the rear surface of the upper cover 21, the display 24 and the sensor sheet 25 are disposed side by side at substantially the same height. The display 24 is, for example, an organic EL display. Various characters such as "HELLO" described above are displayed on the display 24.

The sensor sheet 25 is transparent and includes five touch sensor units 25a, 25b, 25c, 25d, and 25e. The five touch sensor units 25a, 25b, 25c, 25d, and 25e are capacitive touch sensors, and detect a change in electrostatic capacitance of portions corresponding to the icons 12. The sensor sheet 25 corresponds to a first capacitive touch sensor. The capacitive touch sensor is a sensor that detects a change in electrostatic capacitance of a capacitor formed of a sensor electrode, a finger of a user, and the like, to thereby detect a touch on an operation surface.

A spacer 26 is disposed on the rear surfaces of the display 24 and the sensor sheet 25, and the FPC 27 is disposed on the rear surface of the spacer 26. The FPC 27 is fixed to the bottom surface of the upper cover 21 by double-sided tapes or the like.

The LEDs 28, the light guides 29, lower sensors 30, and an acceleration sensor 31 are fixed to an upper surface of the FPC 27, which is adjacent to the display cover 23. A sensor control IC 32 (refer to FIG. 3) is mounted on the lower surface of the FPC 27.

The number of the light guides 29 is the same as the number of the icons 12, and each of the light guides 29 is disposed at a position facing each icon 12. The light guides 29 are made of a transparent light guide material such as acrylic resin. The same number of LEDs 28 as that of the light guides 29 are provided as the light sources, and each LED 28 is disposed at a position adjacent to each light guide 29. The brightness of the LED 28 can be adjusted by adjusting a drive current.

The lower sensors 30a, 30b, 30c, 30d, and 30e are formed on the lower FPC 27 of the light guides 29a, 29b, 29c, 29d, and 29e, respectively. If the five lower sensors 30a, 30b, 30c, 30d, and 30e are not distinguished from each other, those lower sensors are referred to as lower sensors 30.

Like the sensor sheet 25, each of the lower sensors 30 is a transparent capacitive touch sensor and corresponds to a second capacitive touch sensor.

In the spacer 26, a portion of the light guide 29 forms a through hole. Therefore, the lower sensors 30 are opposed to the sensor sheet 25 through the light guides 29. A gap exists between the light guide 29 and the sensor sheet 25. When the display cover 23 is pressed and bent by the finger of the user, the sensor sheet 25 is bent downward in accordance with the bending of the display cover 23. At this time, a gap between the light guides 29 and the sensor sheet 25 becomes narrow, and the electrostatic capacitance detected by the lower sensors 30 changes, so that the lower sensors 30 can detect that the finger of the user is pressing the display cover 23. In other words, a configuration in which the sensor sheet 25 and the lower sensors 30 are disposed on the rear surface of the display cover 23 forms the pressure sensor 33 which detects that the position at which the icon 12 of the display cover 23 is displayed is pressed by the output of the lower sensors 30.

The position at which the icon 12 is displayed on the display cover 23 is an icon selection position at which the icons 12a to 12e are selected by the touch sensor units 25a to 25e.

The acceleration sensor 31 is for detecting acceleration generated in the portable device 1, and is preferably a three-axis sensor, but may be a two-axis sensor or a one-axis sensor. The acceleration sensor 31 outputs an acceleration signal representing the detected acceleration.

The communication board 34 is disposed in an accommodation space defined by the upper cover 21 and the lower cover 22. A connector 35 (refer to FIG. 3) is mounted on the rear surface of the communication board 34. The communication board 34 and the FPC 27 are electrically connected to each other through the connector 35. Therefore, a part of the components mounted on the communication board 34 can be mounted on the FPC 27. On the contrary, some of the components mounted on the FPC 27 can be mounted on the communication board 34.

A battery 36 and a communication control IC 37 (refer to FIG. 3) are mounted on the rear surface of the communication board 34. Since the communication board 34 and the FPC 27 are electrically connected by the connector 35, an electric power of the battery 36 is also supplied to the electrical components mounted on the FPC 27. The battery 36 is a button type battery in the present embodiment. The communication control IC 37 performs the control for transmitting the control signal and the like.

An RF antenna 38 and an LF antenna 39 (refer to FIG. 3) are also mounted on the communication board 34. The RF antenna 38 is an antenna for transmitting radio waves in an RF band, such as 315 MHz. The LF antenna 39 is an antenna for receiving radio waves in an LF band such as 135 kHz.

A tactile switch 40 is mounted on the side surface of the communication board 34. The tactile switch 40 can be pushed from an outside of the portable device 1 through a knob 41 disposed on the side surface of the lower cover 22. The tactile switch 40 is turned on only at the time of being pressed.

An emergency key 42, a release hook 43, a spring 44, and the like are also accommodated in the accommodation space of the housing 20. The emergency key 42 is a mechanical key which is inserted into a key cylinder provided in the vehicle and directly locks and unlocks the vehicle door, a trunk, or the like. The emergency key 42 can be used as an emergency when a communication function of the portable device 1 is disabled due to a battery depletion.

The emergency key 42 includes a key portion 42a inserted into the key cylinder, and a grip portion 42b gripped by the user when the key portion 42a is inserted into the key cylinder. When the emergency key 42 is held by the portable device 1, the grip portion 42b configures a part of an outer shape of the portable device 1, more specifically, a part of a lower side surface of the portable device 1.

The release hook 43 and the spring 44 function as a holding mechanism for holding the emergency key 42 to the portable device 1. The release hook 43 engages a portion of the emergency key 42 when the release hook 43 is located at a locked position due to an urging force of the spring 44. When the release hook 43 is moved by the user in a direction opposite to the direction of urging the release hook 43 by the spring 44, the engagement between the emergency key 42 and the release hook 43 is released, and the emergency key 42 can be pulled out of the portable device 1.

Figure 3:
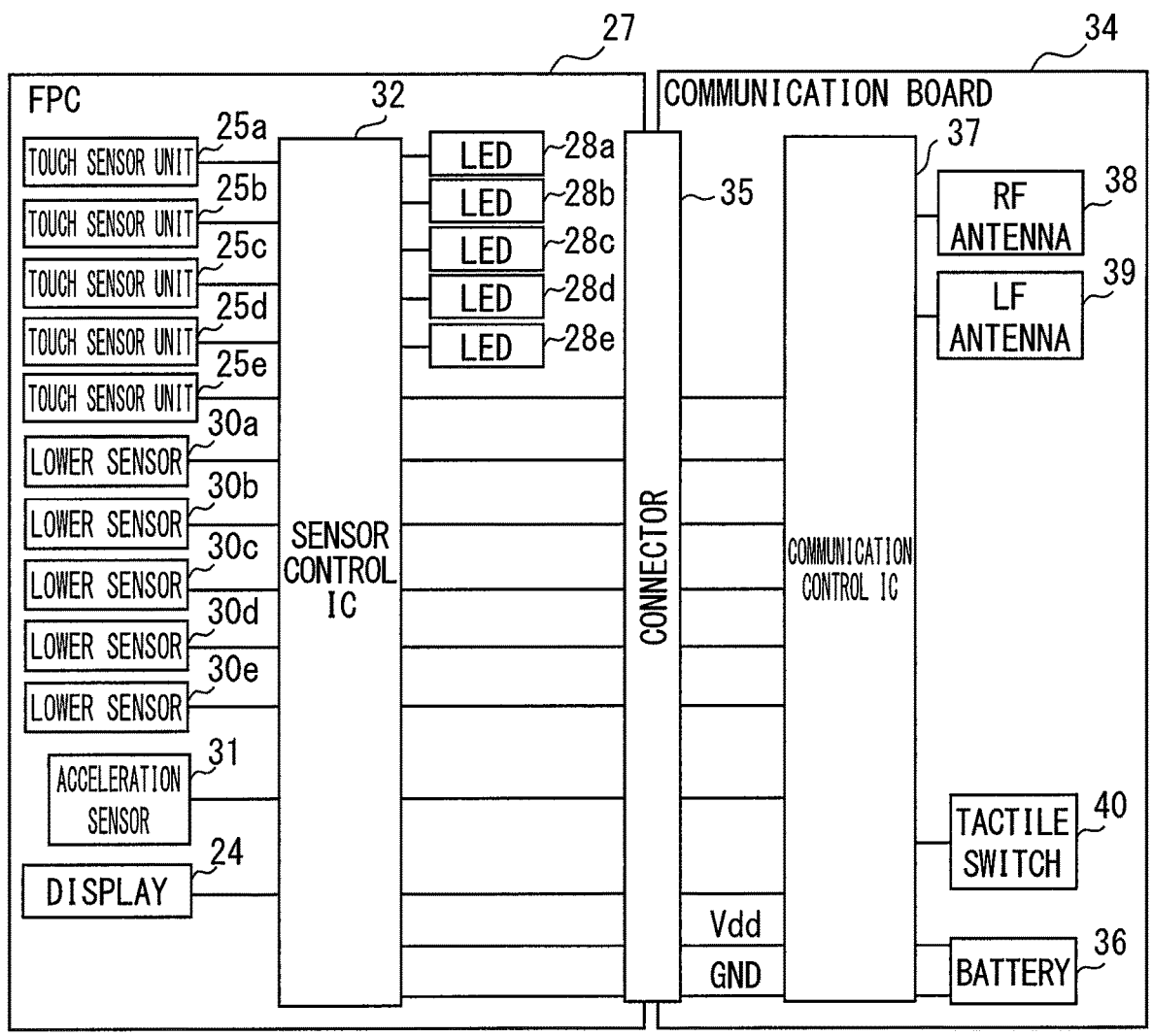
FIG. 3 is a block diagram showing an electrical configuration of the portable device.

FIG. 3 is a diagram showing an electrical configuration of the portable device 1. As shown in FIG. 3, the touch sensor units 25a to 25e, the lower sensors 30a to 30e, the LEDs 28a to 28e, the acceleration sensor 31, and the display 24 are connected to the sensor control IC 32. On the other hand, the RF antenna 38, the LF antenna 39, and the tactile switch 40 are connected to the communication control IC 37.

The battery 36 is mounted on the communication board 34. However, since the communication board 34 and the FPC 27 are connected to each other through the connector 35, an electric power from the battery 36 is also supplied to various electronic components executed on the FPC 27.

Both the sensor control IC 32 and the communication control IC 37 are computers each including a CPU, a ROM, a RAM, and the like, and are connected to each other by multiple signal lines and the connector 35. The sensor control IC 32 detects that the icons 12a to 12e have been touched on the basis of the signals supplied from the touch sensor units 25a to 25e. Further, the sensor control IC 32 detects that the icons 12a to 12e are pressed based on the signals supplied from the lower sensors 30a to 30e.

After the icons 12a to 12e are selected, the sensor control IC 32 outputs, to the communication control IC 37, a signal indicating that a pressing operation has been detected, when the pressing operation is detected after the operation of selecting the icons 12a to 12e.

In addition, the sensor control IC 32 detects that an acceleration equal to or greater than the activation threshold occurs in the portable device 1 based on signals supplied from the acceleration sensor 31. The activation threshold is a threshold capable of detecting the acceleration generated when the portable device 1 is lifted. Further, when detecting that the acceleration equal to or greater than the activation threshold has occurred in the portable device 1, the sensor control IC 32 causes the portable device 1 to be activated for a predetermined period of time.

The activated state is a state in which an electric power is supplied to the touch sensor units 25a to 25e and the lower sensors 30a to 30e, and the touch sensor units 25a to 25e and the lower sensors 30a to 30e can output a signal corresponding to a change in electrostatic capacitance. The sensor control IC 32 performs a drive control of the LEDs 28a to 28e and the display control of the display 24. Therefore, the sensor control IC 32 functions as a display control unit.

At the time of starting the activated state, the LEDs 28a to 28e are turned on, and a predetermined character is displayed on the display 24. On the other hand, a state in which no electric power is supplied to the touch sensor units 25a to 25e and the lower sensors 30a to 30e represents a sleep state.

Since the FPC 27 and the communication board 34 are electrically connected to each other by the connector 35, the communication control IC 37 may execute some or all of the functions of the sensor control IC 32 described above. Conversely, the sensor control IC 32 may execute some or all of the functions of the communication control IC 37.

The sensor control IC 32 controls whether the portable device 1 is set to the activated state or the sleep state. When the communication control IC 37 acquires a signal indicating that the icon 12 has been pressed from the sensor control IC 32, the communication control IC 37 transmits radio waves representing the control signal determined in accordance with the pressed icon 12 from the RF antenna 38. Therefore, the communication control IC 37 functions as a transmission control unit.

The communication control IC 37 demodulates the radio waves received by the LF antenna 39 and sequentially determines whether or not a request signal from the in-vehicle device has been received. When it is determined that the request signal has been received, the communication control IC 37 generates a response signal responsive to the request signal and transmits the response signal from the RF antenna 38.

When the tactile switch 40 is pressed in the sleep state, the sensor control IC 32 shifts the portable device 1 to the activated state. On the other hand, when the tactile switch 40 is pressed for a short time in the activated state, the portable device 1 is shifted to the sleep state.

Figure 4:
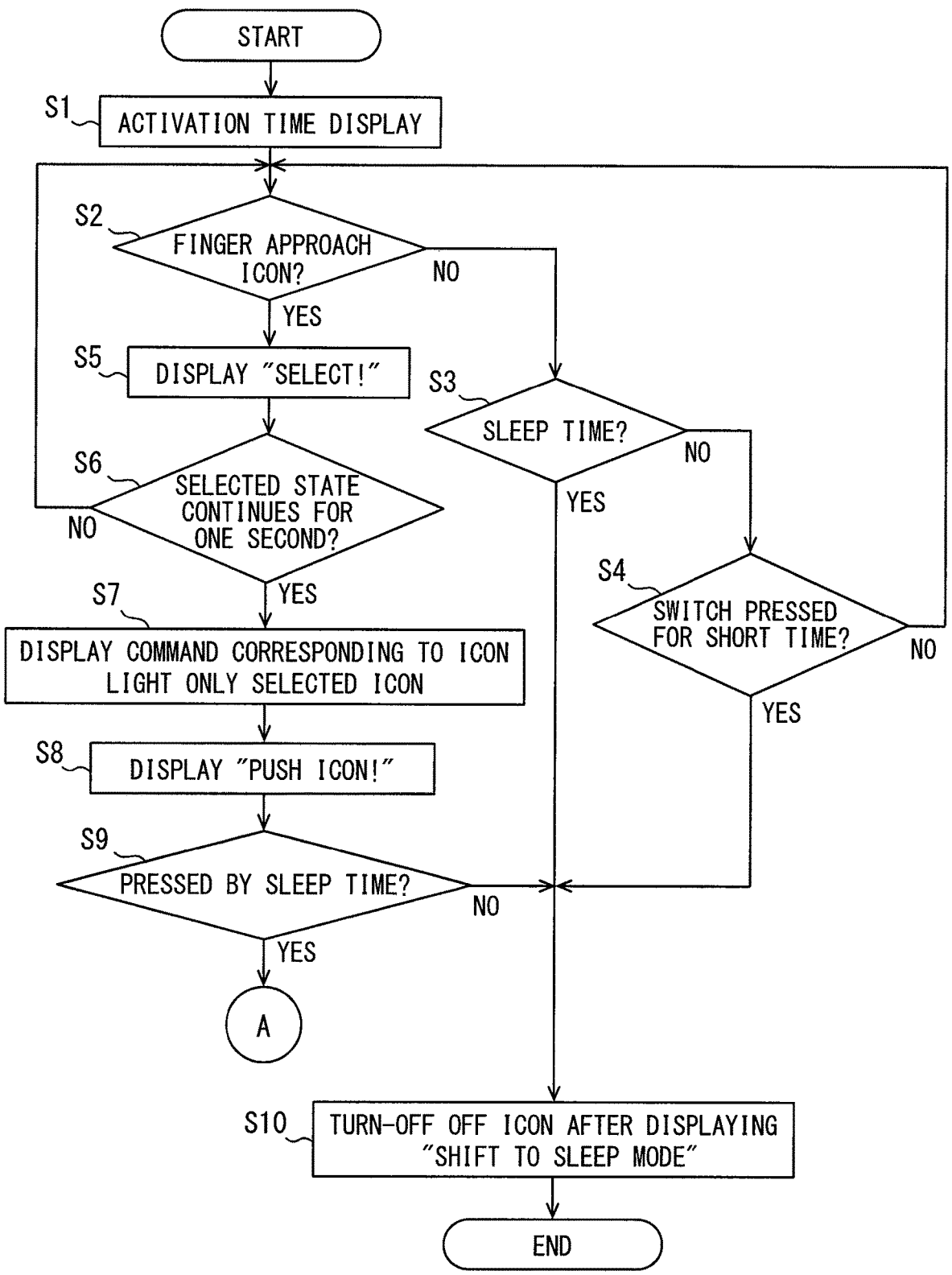
FIG. 4 is a flowchart showing a process to be executed by a sensor control and a communication control.

FIG. 4 is a flowchart showing a process executed by the sensor control IC 32 and the communication control IC 37. Since the sensor control IC 32 and the communication control IC 37 are connected to each other, either the sensor control IC 32 or the communication control IC 37 may execute the processes of the respective steps shown in FIG. 4. In addition, the processes in the respective steps may be shared and executed by the sensor control IC 32 and the communication control IC 37. For example, in FIG. 4, Step S10 is executed by the communication control IC 37, and the other steps are executed by the sensor control IC 32.

The process shown in FIG. 4 is started when the portable device 1 changes from the sleep state to the activated state. When the acceleration detected by the acceleration sensor 31 becomes equal to or greater than the activation threshold in the sleep state, or when the tactile switch 40 is pressed for a short time in the sleep state, the sleep state shifts to the activated state.

In the case of transition to the activated state, first, at Step (hereinafter Step will be omitted) S1, an activation time display is performed. In the activation time display, an activation time character string set as a character string to be displayed at the time of activation is displayed on the display 24. The activation time character strings are, for example, "HELLO!" or "HELLO! STAND READY!".

In the activation time display, all the icons 12 are also turned on. According to the present embodiment, the brightness of the icons 12 at the time of activation is set to be lower than the brightness when one icon 12 is selected. For example, the brightness of the icon 12 at the time of activation is 20% of the brightness when one icon 12 is selected.

At the time of activation, the electric power is supplied to the sensor sheet 25 and the lower sensor 30. As a result, the touch sensor units 25a to 25e can detect that a finger or the like touches the icon 12, and the pressure sensor 33 can detect that a portion of the icon 12 is pressed.

At S2, it is determined whether or not the finger or the like is brought in contact with the icon 12. In the above determination, it is determined whether or not an operating body such as the finger touches a portion of the display cover 23 where the icon 12 is displayed, or approaches a distance close to the portion. This determination is made based on a magnitude of the electrostatic capacitance represented by the signals output from the touch sensor units 25a to 25e.

If the determination at S2 is NO, the process proceeds to S3. At S3, it is determined whether or not a time during which no operation is continued is equal to or longer than the sleep time. The sleep time is appropriately set, and is, for example, 5 seconds or 10 seconds. If the determination at S3 is YES, the process proceeds to S10. In the case of proceeding to S10, the portable device 1 enters the sleep state. The reason for the sleep state is to reduce a power consumption.

If the determination at S3 is NO, the process proceeds to S4. At S4, it is determined whether or not the tactile switch 40 has been pressed for a short time. Since the process also proceeds to S10 when the determination at S4 is YES, the portable device 1 enters the sleep state.

If the determination at S4 is also NO, the process returns to the determination at S2. When the determination at S2 is YES, it means that any one of the icons 12a to 12e is selected by the touch operation. Therefore, at S5, "SELECT!" which is a message indicating that the icon 12 has been selected is displayed on the display 24.

At S6, it is determined whether or not the state in which one icon 12 has been selected continues for 1 second or longer. One second is a time for determining the selection of the icon 12, and one second is an example, and a time other than one second may be used. If the determination at S6 is NO, the process also returns to S2. On the other hand, when the determination at S6 is YES, the process proceeds to S7.

At S7, the command corresponding to the selected icon 12 is displayed on the display 24. If the selected icon 12 is an icon 12a indicating that the vehicle doors are locked, "LOCK" is displayed on the display 24, for example. Only the selected icon 12 is turned on, the other icons 12 are turned off, and the brightness of the selected icon 12 is set to the maximum value.

At S8, "PUSH ICON!" which is a message indicating the next operation is displayed on the display 24. At S9, it is determined whether or not the selected icon 12 has been pressed by the sleep time. The sleep time is the same time as S3. If the determination at S9 is NO, the process proceeds to S10.

At S10, "SHIFT TO SLEEP MODE", which is a message indicating a transition to the sleep state, is displayed on the display 24. Thereafter, the display 24 is turned off. The icons 12 are also turned off. In other words, the display unit 10 is turned off.

Figure 5:
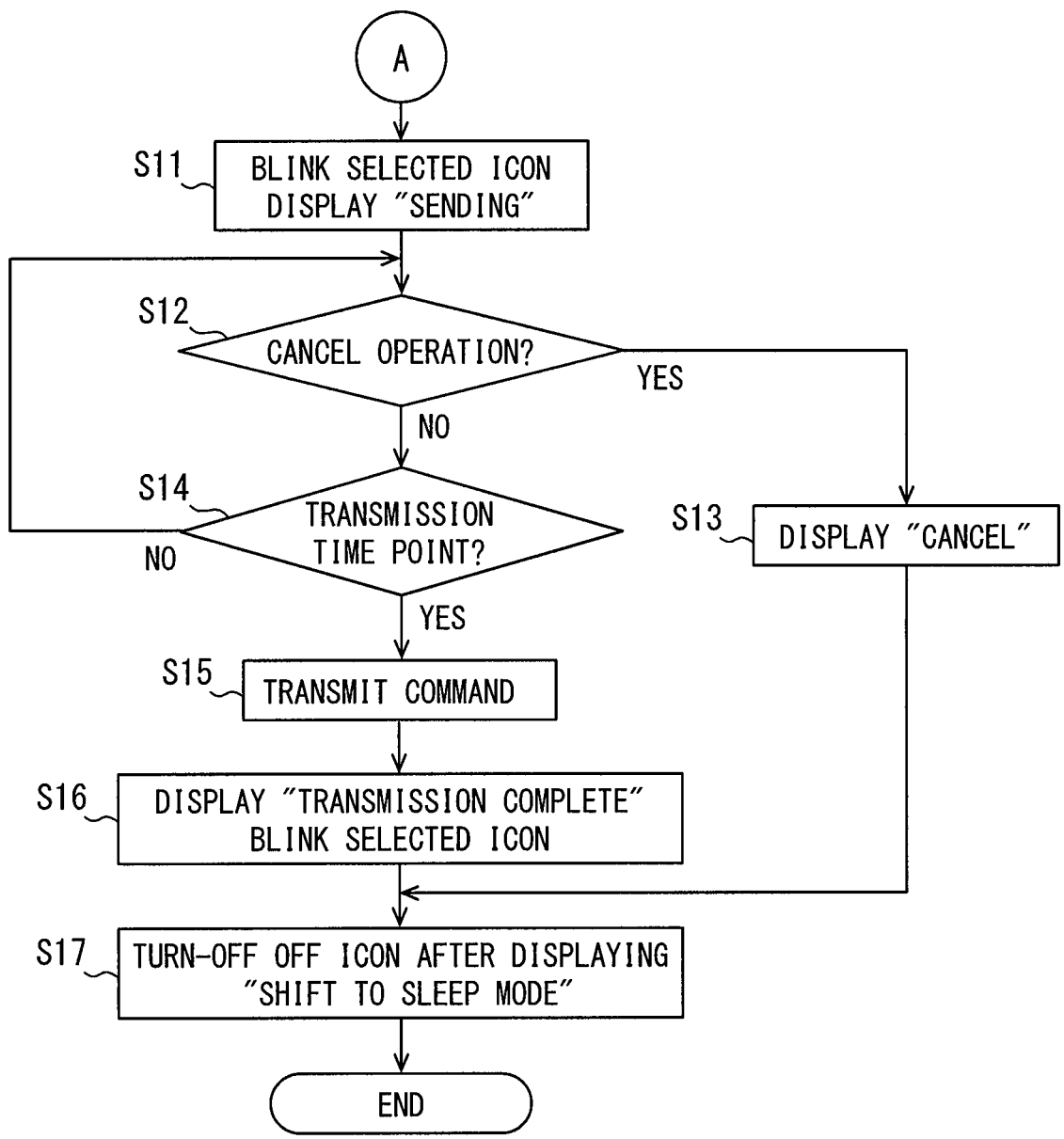
FIG. 5 is a flowchart showing the process to be executed by the sensor control and the communication control subsequent to FIG. 4.

If the determination at S9 is YES, the process proceeds to S11 shown in FIG. 5. At S11, the pressed icon 12 is blinked and "SENDING" is displayed on the display 24. The "SENDING" is a message meaning that the message is in a waiting state in which the control signal is to be transmitted from now. It should be noted that this message may be made to blink in the same manner as the icon 12.

At S12, it is determined whether or not a cancel operation has been performed. Specifically, the cancel operation is an operation of pressing the tactile switch 40 for a short time. If the determination at S12 is YES, the process proceeds to S13. At S13, the display 24 displays a "CANCEL" message which means canceling the pressing operation of the icon 12. After the execution of S13, the process proceeds to S17, and the portable device 1 is put into the sleep state without transmitting the control signal.

If the determination at S12 is NO, the process proceeds to S14. At S14, it is determined whether or not to reach a transmission time point. The transmission time point is determined according to the number of blinking times of the icon 12 or the elapsed time from the time when the icon 12 is pressed. For example, the time point at which the icon 12 blinks five times can be set as the transmission time point. Further, the transmission time point can be a time point at which 3 to 5 seconds have elapsed from the time point at which the icon 12 is pressed. If the determination at S14 is NO, the process returns to S12. On the other hand, if the determination at S14 is YES, the process proceeds to S15.

At S15, a control signal instructing to execute a command corresponding to the pressed icon 12 is transmitted to the in-vehicle device. Then, at S16, "TRANSMISSION COMPLETE", which is a message indicating that the transmission of the command is completed, is displayed on the display 24. In addition, the icon 12 being selected is blinked. The number of blinks is, for example, one while the message is being displayed, and three after the display of the message has been completed.

After the determination at S9 becomes YES, the transmission of the control signal can be canceled when it is noticed that the operation should not be performed after the operation of pressing the icon 12 by waiting until the transmission time point and enabling the cancel operation until the transmission time point. For example, when the icon 12e for instructing the opening and closing of the back door of the vehicle is pressed, but when it is noticed that the back door of the vehicle will contact an obstacle after the pressing operation, the transmission of the control signal for instructing the opening of the back door can be cancelled.

When S16 is executed, the process also proceeds to S17. At S17, "SHIFT TO SLEEP MODE", which is a message indicating the transition to the sleep state, is displayed on the display 24. Thereafter, the display 24 is turned off. The icons 12 are also turned off. In other words, the display unit 10 is turned off.

In the portable device 1 according to the present embodiment, when it is detected that an acceleration equal to or greater than the activation threshold occurs in the portable device 1 based on the acceleration signal output from the acceleration sensor 31, S1 is executed and the icon 12 is displayed on the display unit 10. Therefore, the user can display the icon 12 on the display unit 10 by simply taking the portable device 1 out from the bag or the pocket without performing an operation such as pressing the ON switch.

In the present embodiment, in addition to the touch sensor units 25a to 25e for selecting any icon 12, a pressure sensor 33 for detecting the pressing force at the icon selection position is provided. Then, when the operation of pressing the icon selection position is detected in a state where the icon 12 is selected, a control signal for instructing the execution of the command is transmitted to the in-vehicle device. Therefore, in order to select the icon 12, the user can transmit a control signal instructing the execution of a command corresponding to the selected icon 12 to the in-vehicle device by touching the icon 12 and then performing the pressing operation as it is. In other words, subsequent to the operation of selecting any icon 12, the user can perform the operation of transmitting the control signal at the position of the finger as it is.

As described above, with the use of the portable device 1 according to the present embodiment, the operation by the user until the control signal is transmitted to the in-vehicle device is facilitated since the operation until the control signal is transmitted to the vehicle mounted device is similar to the operation of merely taking the portable device 1 out from a bag or a pocket and pressing a button once.

In the portable device 1 according to the present embodiment, the selection operation per se of the icon 12 is performed by the capacitive touch sensor units 25a to 25e. Therefore, even if the portable device 1 put in the bag is pressed, any icon 12 can be restricted from being unintentionally selected to transmit the control signal.

In the portable device 1 according to the present embodiment, the pressure sensor 33 is configured by disposing the lower sensor 30 to the rear surface of the sensor sheet 25. In other words, since the sensor sheet 25 is also used as a component of the pressure sensor 33, the pressure sensor 33 can be configured at low cost.

Further, as indicated at S11 and S12, when the control signal is transmitted, the portable device 1 according to the present embodiment enters the sleep state without waiting for the sleep time. As a result, a power saving is achieved as compared with the case where the sleep state is entered after waiting for the elapse of the sleep time.

The display unit 10 of the portable device 1 according to the present embodiment includes a message display region 11 at a position different from the icon display region 13. Various messages are displayed in the message display region 11. For example, "TRANSMISSION COMPLETE" which is a message indicating that control signals have been transmitted is displayed in the message display region 11. Even if it is difficult for the user to understand that the pressing operation has been performed from the feeling of the finger, the user can recognize that the pressing operation could have been performed by displaying this message in the message display region 11.

Although the embodiment of the present disclosure have been described above, the present disclosure is not limited to the above-described embodiment, and the following modifications are included in the technical scope of the present disclosure, and can be implemented by various modifications within a scope not departing from the spirit described below. In the following description, elements having the same reference numerals as those used so far are the same as elements having the same reference numerals in the previous embodiments, except when specifically mentioned. When only a part of the configuration is described, the above-described embodiment can be applied to other parts of the configuration.

Modification 1

In the above-described embodiment, the five lower sensors 30a to 30e are provided corresponding to the five touch sensor units 25a to 25e provided for detecting which icon 12 is selected. However, which icon 12 is selected can be detected by the touch sensor units 25a to 25e. Therefore, it is unnecessary for the lower sensors 30 to detect that a portion corresponding to which icon 12 has been pressed.

The user presses the same display cover 23 regardless of which of the five icons 12 is pressed. Therefore, even when any of the icons 12 is pressed, the display cover 23 also bends in a portion different from the pressed portion.

The lower sensor 30 may be fewer than in the above-described embodiment if a change in electrostatic capacitance between and the lower sensor 30 and the sensor sheet 25 can be detected when any portion of the five icon selection positions is pressed on the display cover 23.

For example, the lower sensors 30a to 30e in the above-described embodiment may be connected to form one sensor. Also, the number of lower sensors 30a to 30e in the above-described embodiment may be reduced to the extent that can detect a change in electrostatic capacitance between the lower sensors 30a to 30e and the sensor sheet 25 when any portion of the five icon selection positions may be pressed on the display cover 23. If the number of the lower sensors 30 is less than the number of the icons 12 that are displayed, that is, if the number of the detecting regions detected by the lower sensors 30 is less than the number of the icons 12 that are displayed, the number of the signal lines to the sensor control IC 32 can be reduced.

Modification 2

The message displayed on the display 24 is not limited to the message described in the above-described embodiment. For example, "SELECT ICON!" may be displayed instead of "SELECT!". Instead of "PUSH ICON!", it may be simply displayed as "PUSH". Also, "complete" may be displayed instead of "Transmission complete". It is needless to say that other messages may be displayed.

Modification 3

In the above-described embodiment, the touch sensor is provided with the capacitive touch sensor, but a touch sensor other than the capacitive touch sensor may be used. For example, a touch sensor based on an ultrasonic surface acoustic wave system, an acoustic pulse recognition system, an infrared ray shielding system, or the like may be used. Those touch sensors do not have mechanical intermittent contacts.

Modification 4

The pressure sensor 33 does not need to have a configuration in which two layers of capacitive touch sensors are stacked, and a sensor for detecting pressure by another method, for example, by a change in resistance value or the like may also be used.

While the disclosure has been described with reference to the embodiments thereof, it is to be understood that the disclosure is not limited to the embodiments and constructions. The disclosure is intended to cover various modification and equivalent arrangements. In addition, the various combinations and configurations, other combinations and configurations, including more, less or only a single element, are also within the spirit and scope of the disclosure.

What is claimed is:

1. A vehicular portable device to be carried by a user of a vehicle and configured to transmit a control signal to an in-vehicle device mounted on the vehicle, the vehicular portable device comprising:
    an acceleration sensor;
    a display unit that displays an icon representing an instruction to the in-vehicle device;
    a display control unit that controls the display unit to display the icon when detecting that an acceleration equal to or greater than an activation threshold occurs in the vehicular portable device based on a signal output from the acceleration sensor;
    a touch sensor to select the icon displayed on the display unit;
    a pressure sensor that detects a pressing force at an icon selection position, which is a position where the icon is selected by the touch sensor; and
    a transmission control unit that transmits a control signal instructing execution of a command corresponding to the icon being selected based on detection of the pressing force by the pressure sensor in a state where the icon is selected.

2. The vehicular portable device according to claim 1, wherein
    the touch sensor is a capacitive touch sensor.

3. The vehicular portable device according to claim 2, wherein
    the capacitive touch sensor used as the touch sensor is a first capacitive touch sensor,
    the vehicular portable device further comprises a second capacitive touch sensor that is disposed to a rear side of the first capacitive touch sensor, and
    the pressure sensor includes the first capacitive touch sensor and the second capacitive touch sensor.

4. The vehicular portable device according to claim 3, wherein
    the display unit displays a plurality of the icons at different positions, and
    the second capacitive touch sensor has detection regions, the number of which is less than the number of the icons that are displayed.

5. The vehicular portable device according to claim 1, wherein
    the display control unit turns off the display unit based on transmission of the control signal by the transmission control unit.

6. The vehicular portable device according to claim 1, wherein
    the display unit includes a display region that indicates transmission of the control signal when the control signal is transmitted at a position different from the icon.

7. The vehicular portable device according to claim 1, wherein
    the acceleration sensor, the display unit, the touch sensor, the pressure sensor, and the transmission control unit are connected to the display control unit.

8. The vehicular portable device according to claim 1, wherein
    each of the display control unit and the transmission control unit includes a processor and a memory.

9. The vehicular portable device according to claim 1, wherein
    the transmission control unit transmits the control signal instructing execution of the command corresponding to the icon being selected when the pressor sensor detects that the pressing force at the icon selection position continues for a predetermined time in the state where the icon is selected.

* * * * *